US009865211B2

(12) United States Patent
Cao

(10) Patent No.: US 9,865,211 B2
(45) Date of Patent: Jan. 9, 2018

(54) SHIFT REGISTER UNIT, GATE DRIVING CIRCUIT AND DISPLAY DEVICE

(71) Applicant: BOE TECHNOLOGY GROUP CO., LTD., Beijing (CN)

(72) Inventor: Kun Cao, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 142 days.

(21) Appl. No.: 14/416,884

(22) PCT Filed: Apr. 2, 2014

(86) PCT No.: PCT/CN2014/074666
§ 371 (c)(1),
(2) Date: Jan. 23, 2015

(87) PCT Pub. No.: WO2015/089954
PCT Pub. Date: Jun. 25, 2015

(65) Prior Publication Data
US 2015/0325190 A1  Nov. 12, 2015

(30) Foreign Application Priority Data
Dec. 20, 2013 (CN) .......................... 2013 1 0711658

(51) Int. Cl.
*G09G 3/36* (2006.01)
*G11C 19/28* (2006.01)

(52) U.S. Cl.
CPC .......... *G09G 3/3677* (2013.01); *G11C 19/28* (2013.01); *G09G 2310/0286* (2013.01)

(58) Field of Classification Search
CPC ................. G11C 19/28; G09G 3/3677; G09G 2310/0286
See application file for complete search history.

(56) References Cited

U.S. PATENT DOCUMENTS 6,339,631 B1   1/2002  Yeo et al.
8,553,026 B2 * 10/2013  Park .................... G09G 3/3266
                                                    345/212
(Continued)

FOREIGN PATENT DOCUMENTS

CN      101645308 A    2/2010
CN      102629459 A    8/2012
(Continued)

OTHER PUBLICATIONS

International Search Report and Written Opinion of the International Searching Authority with Notice of Transmittal of the International Search Report and Written Opinion of PCT/CN2014/074666 in Chinese, dated Sep. 3, 2014.
(Continued)

*Primary Examiner* — Christopher E Leiby
(74) *Attorney, Agent, or Firm* — Collard & Roe, P.C.

(57) ABSTRACT

There are provided a shift register unit, a gate driving circuit and a display device, which enable gate lines in non-output rows to remain in the state of no signal outputting. The shift register unit comprises an input module (10), a pull-up module (20), a pull-down control module (30), a first pull-down module (31), a second pull-down module (40) and a reset module (50). In the non-output time, the first pull-down module and the second pull-down module pull down the output voltages of the pull-up modules connected thereto to a low level alternately, thereby enabling gate lines in non-output rows to remain in the state of no signal outputting.

19 Claims, 5 Drawing Sheets

(56) References Cited

U.S. PATENT DOCUMENTS

| | | | |
|---|---|---|---|
| 8,842,061 B2 | 9/2014 | Chen et al. | |
| 2008/0048712 A1* | 2/2008 | Ahn | G09G 3/3677 326/21 |
| 2009/0256794 A1 | 10/2009 | Jang et al. | |
| 2010/0201666 A1* | 8/2010 | Tobita | G09G 3/3677 345/208 |
| 2011/0058640 A1 | 3/2011 | Shang et al. | |
| 2012/0113088 A1* | 5/2012 | Han | G09G 3/3674 345/212 |
| 2012/0256817 A1 | 10/2012 | Chen et al. | |
| 2014/0050294 A1 | 2/2014 | Cao et al. | |
| 2014/0064439 A1* | 3/2014 | Qing | G11C 19/28 377/75 |
| 2014/0079173 A1 | 3/2014 | Yan et al. | |
| 2014/0086379 A1 | 3/2014 | Ma et al. | |
| 2014/0168044 A1 | 6/2014 | Hu et al. | |

FOREIGN PATENT DOCUMENTS

| | | |
|---|---|---|
| CN | 102651186 A | 8/2012 |
| CN | 102654986 A | 9/2012 |
| CN | 202502720 U | 10/2012 |
| CN | 102983132 A | 3/2013 |
| CN | 103035298 A | 4/2013 |
| CN | 103345941 A | 10/2013 |
| CN | 103413531 A | 11/2013 |
| WO | 2013/060285 A1 | 5/2013 |
| WO | 2013/174134 A1 | 11/2013 |

OTHER PUBLICATIONS

Chinese Office Action of Chinese Application No. 201310711658.9, dated May 6, 2015 with English translation.
English translation of the International Preliminary Report on Patentability and Written Opinion of the International Searching Authority of PCT/CN2014/074666, dated Jun. 21, 2016.
Second Chinese Office Action of Chinese Application No. 201310711658.9, dated Oct. 28, 2015 with English translation.
European Search Report in European Patent Application No. 14861172.6.

* cited by examiner

SHIFT REGISTER UNIT, GATE DRIVING CIRCUIT AND DISPLAY DEVICE

CROSS REFERENCE TO RELATED APPLICATIONS

This application is the National Stage of PCT/CN2014/074666 filed on Apr. 2, 2014, which claims priority under 35 U.S.C. §119 of Chinese Application No. 201310711658.9 filed on Dec. 20, 2013, the disclosure of which is incorporated by reference.

TECHNICAL FIELD OF THE DISCLOSURE

The present disclosure relates to the field of display technology, and in particular, to a shift register unit, a gate driving circuit and a display device.

BACKGROUND

The LCD (Liquid Crystal Display) has been widely used in electronic products such as notebook computers, flat TV sets or mobile phones due to its advantages such as low radiation, small volume, low energy consumption and so on.

The LCD is formed by staggering pixel matrices located in the horizontal direction and the vertical direction. When the LCD displays, a data driving circuit can latch the input display signals and the clock signal timing sequentially, and convert the input display data into an analog signal and then input it into data lines of a liquid crystal panel; a gate driving circuit can convert the input clock signals into a voltage for controlling pixels to turn on/turn off through shift registers, and apply it to gate lines of the liquid crystal panel row by row.

In order to further reduce the production cost of liquid crystal display products, the gate driving circuit known in the art typically uses the GOA (Gate Driver On Array) design to integrate the TFT (Thin Film Transistor) gate switch circuit on the array substrate of the display panel to form scan driving for the display panel. Therefore, the gate driving integrated circuit part can be omitted, which can reduce the product cost in terms of both material cost and manufacturing process. In addition, the display panel can be made in a beautiful design with symmetric sides and a narrow frame. The gate switch circuit integrated on the array substrate by the GOA technology is also referred to as a GOA circuit or a shift register circuit.

In the GOA circuit known in the art, the turning on or turning off of a TFT is needed to realize the turning on or turning off of a gate line in a corresponding row. In particular, it is possible to input a control signal to a TFT of the GOA circuit through a signal input terminal to turn off the TFT, thereby controlling the gate line in a row corresponding to the TFT not to output a signal. However, when the control signal is an AC (Alternate Current) square wave, the OFF state of the TFT will have interruption intervals; therefore, it cannot be guaranteed that the gate line in the row corresponding to the TFT always keeps in the state of no signal outputting during the non-output period. If a DC (Direct Current) signal is used to control the turning off of the TFT, although the occurrence of the above interruption intervals can be avoided, the threshold voltage of the TFT which is at the DC high level for a long time will shift, and finally the TFT cannot be normally turned on. Thereby, the stability of the TFT and the GOA circuit is reduced.

SUMMARY

According to embodiments of the present disclosure, there are provided a shift register unit, a gate driving circuit and a display device, which enable gate lines in non-output rows to remain in the state of no signal outputting.

Embodiments of the present disclosure can employ the following technical solutions.

According to one aspect of embodiments of the present disclosure, there is provided a shift register unit comprising:

an input module connected to a first signal input terminal and a pull-up control node respectively, and configured to control potential of the pull-up control node according to a signal input by the first signal input terminal;

a pull-up module connected to a first clock signal terminal, the pull-up control node and a signal output terminal of the present stage respectively, and configured to make the signal output terminal of the present stage output a signal of the first clock signal terminal under the control of the pull-up control node;

a pull-down control module connected to a voltage terminal, the pull-up control node, the first signal input terminal, and a pull-down control node respectively, and configured to control the level of the pull-down control node according to the signal input by the first signal input terminal and the level of the pull-up control node;

a first pull-down module connected to the voltage terminal, the pull-down control node and the signal output terminal of the present stage respectively, and configured to pull down a signal output by the signal output terminal of the present stage to a low level under the control of the pull-down control node;

a second pull-down module connected to the voltage terminal, a second clock signal terminal and the signal output terminal of the present stage respectively, and configured to pull down the signal output by the signal output terminal of the present stage to a low level according to a signal input by the second clock signal terminal; and a reset module connected to the voltage terminal, a second signal input terminal, the pull-up control node and the signal output terminal of the present stage respectively, and configured to reset the potential of the pull-up control node and the signal output by the signal output terminal of the present stage according to a signal input by the second signal input terminal.

According to another aspect of embodiments of the present disclosure, there is provided a gate driving circuit comprising shift register units described as the above;

the signal input terminal of each shift register unit except for the first stage of shift register unit is connected to the signal output terminal of the present stage of its adjacent previous stage of shift register unit; and the signal output terminal of the present stage of each shift register except for the last stage of shift register unit is connected to the signal input terminal of its adjacent next stage of shift register unit.

According to yet another aspect of embodiments of the present disclosure, there is provided a gate driving circuit as described in the above.

Embodiments of the present disclosure provide a shift register unit, a gate driving circuit and a display device. The shift register unit comprises an input module, a pull-up module, a pull-down control module, a first pull-down module, a second pull-down module and a reset module. In the non-output time, the first pull-down module and the second pull-down module pull down the output voltages of the pull-up modules connected thereto to a low level alternately, enabling gate lines in non-output rows to remain in the state of no signal outputting.

BRIEF DESCRIPTION OF THE DRAWINGS

In order to explain the technical solutions of embodiments of the present disclosure more clearly, in the following, the drawings required in the description of the embodiments will be briefly introduced. Obviously, the drawings in the following description are only part embodiments of the present disclosure. For those skilled in the art, other drawings can be obtained based on these drawings without creative work.

DETAILED DESCRIPTION

In the following, clear and complete description will be made on technical solutions of embodiments of the present disclosure in connection with the figures. Obviously, the described embodiments are only part embodiments of the present disclosure, but not all the embodiments. Based on the embodiments in the present disclosure, all other embodiments obtained by those skilled in the art without creative work fall in the protection scope of the present disclosure.

The transistor adopted in all embodiments of the present disclosure can be a TFT or a FET (Field Effect Transistor) or any other device with the same characteristics. Since the source and the drain of the transistor used herein are symmetrical, the source and the drain have no difference. In embodiments of the present disclosure, in order to distinguish the two electrodes other than the gate of the transistor, one of the two electrodes is referred to as the source, and the other electrode is referred to as the drain. In addition, the transistors can be classified into N type transistors and P type transistors in terms of their characteristics. In embodiments of the present disclosure, when an N type transistor is used, its first electrode can be the source and the second electrode can be the drain. When a P type transistor is used, its first electrode can be the drain and the second electrode can be the source. The transistors used in embodiments of the present disclosure can be all N type transistors or all P type transistors. In the following embodiments, description is made by taking the transistors being all N type transistors as examples. It can be devised that the time sequence of the driving signals needs to be adjusted accordingly when the transistors are all P type transistors.

Figure 1:
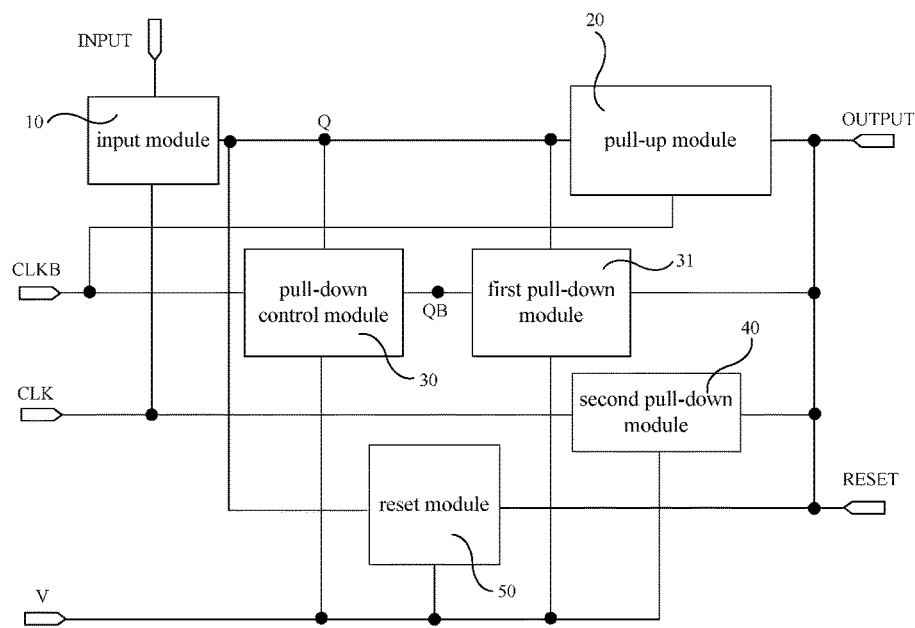
FIG. 1 is a schematic structural diagram of a shift register unit according to an embodiment of the present disclosure.

As shown in FIG. 1, a shift register unit according to an embodiment of the present disclosure comprises an input module 10, a pull-up module 20, a pull-down control module 30, a first pull-down module 31, a second pull-down module 40 and a reset module 50.

In FIG. 1, the input module 10 is connected to a first signal input terminal INPUT and a pull-up control node Q, and configured to control the potential of the pull-up control node Q according to a signal input by the first signal input terminal INPUT.

The pull-up module 20 is connected to a first clock signal terminal CLKB, the pull-up control node Q and a signal output terminal OUTPUT of the present stage, respectively, and configured to make the signal output terminal OUTPUT of the present stage output a signal of the above first clock signal terminal CLKB under the control of the potential of the pull-up control node Q.

The pull-down module 30 is connected to a voltage terminal V, the pull-up control node Q, the first clock signal terminal CLKB respectively, and a pull-down control node QB, and configured to control the potential of the pull-down control node QB according to the signal input by the first clock signal terminal CLKB and the potential of the pull-up control node Q.

The first pull-down module 31 is connected to the voltage terminal V, the pull-down control node QB and the signal output terminal OUTPUT of the present stage respectively, and configured to pull down a signal output by the signal output terminal OUTPUT of the present phase To a low level under the control of the potential of the pull-down control node QB.

The second pull-down module 40 is connected to the voltage terminal V, a second clock signal terminal CLK and the signal output terminal OUTPUT of the present stage respectively, and configured to pull down the signal output by the signal output terminal OUTPUT of the present phase To a low level according to a signal input by the second clock signal terminal CLK.

Figure 2:
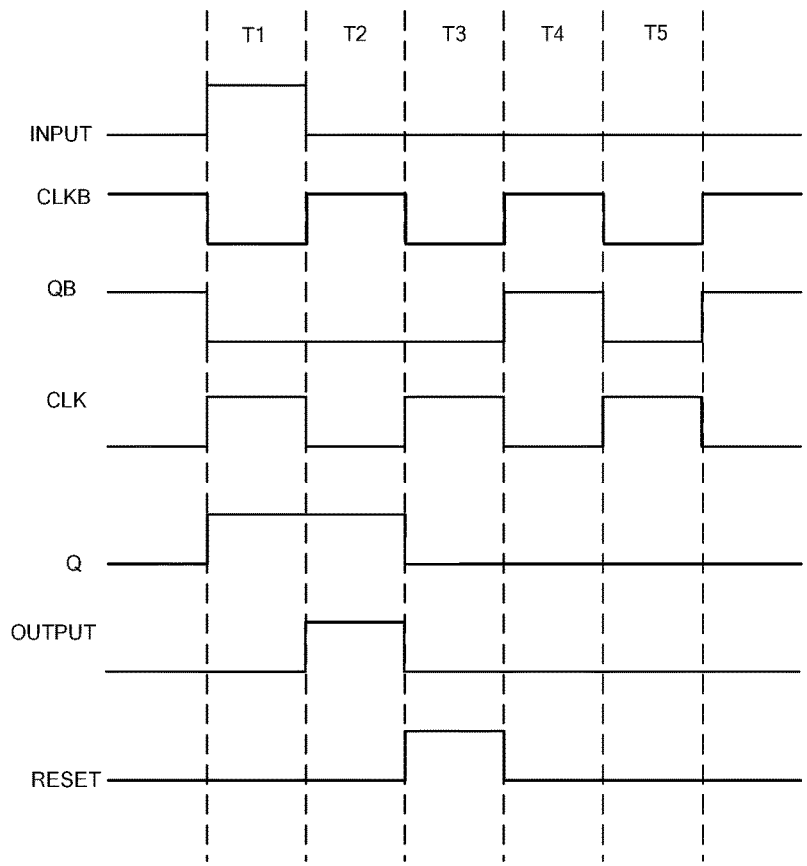
FIG. 2 is an operation signal time sequence waveform of a shift register unit according to an embodiment of the present disclosure.

It is noted that, as shown in FIG. 2, the signals input by the first clock signal terminal CLKB and the second clock signal terminal CLK have the same period but inverse phases.

In FIG. 1, the reset module 50 is connected to the voltage terminal V, a second signal input terminal RESET, the pull-up control node Q and the signal output terminal OUTPUT of the present stage, respectively, and configured to reset the level of the pull-up control node Q and the signal output by the signal output terminal OUTPUT of the present stage according to a signal input by the second signal input terminal RESET.

It is noted that the voltage terminal V can be a grounded terminal or input a low level VSS or VGL, or alternatively, the voltage terminal V can also be at a high voltage Vdd. Since description is made by exemplarily taking transistors in embodiments of the present disclosure to be N type transistors, the following embodiments are described by taking that the voltage terminal V inputs the low level VGL as examples.

An embodiment of the present disclosure provides a shift register unit. The shift register unit comprises an input module, a pull-up module, a pull-down control module, a first pull-down module, a second pull-down module and a reset module. In the non-output time, the first pull-down module and the second pull-down module pull down the output voltages of the pull-up modules connected thereto to a low level alternately, enabling gate lines in non-output rows to remain in the state of no signal outputting.

Figure 3:
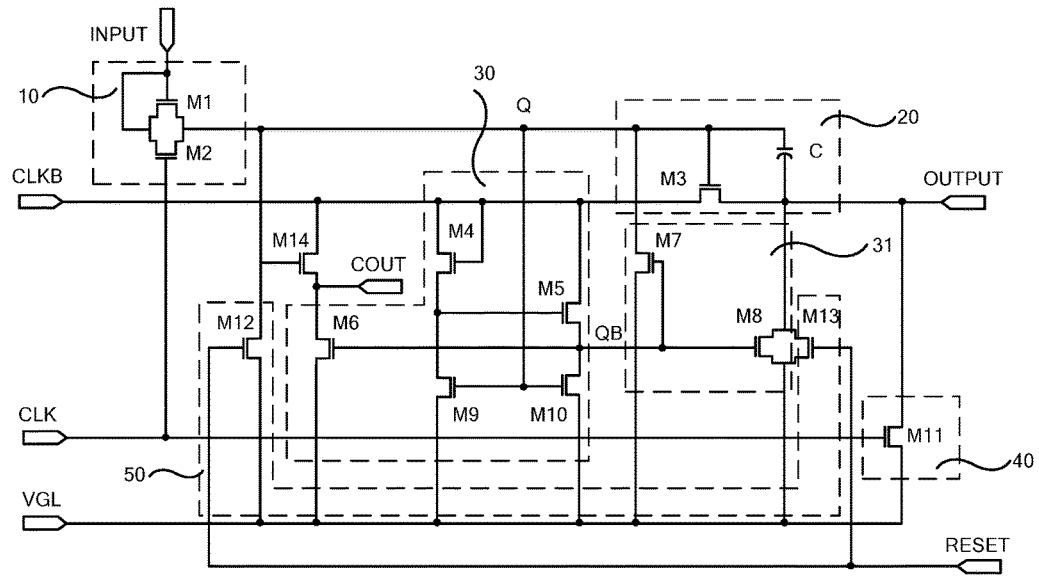
FIG. 3 is a schematic structural diagram of another shift register unit according to an embodiment of the present disclosure.

Further, as shown in FIG. 3, the input module 10 can comprise: a first transistor M1 whose first electrode and gate are connected to the first signal input terminal INPUT and whose second electrode is connected to the pull-up control node Q; a second transistor M2 whose first electrode is connected to the first signal input terminal INPUT, whose gate is connected to the second clock signal terminal CLK and whose second electrode is connected to the pull-up control node Q.

Further, the pull-up module 20 comprises: a third transistor M3 whose first electrode is connected to the first clock signal terminal CLKB, whose gate is connected to the pull-up control node Q and whose second electrode is connected to the signal output terminal OUTPUT of the present stage; and a capacitor C connected between the gate and the second electrode of the third transistor in parallel.

Further, the pull-down control module 30 comprises: a fourth transistor M4 whose first electrode and gate are connected to the first clock signal terminal CLKB; a fifth transistor M5 whose first electrode is connected to the first clock signal terminal CLKB, whose gate is connected to the second electrode of the fourth transistor M4 and whose second electrode is connected to the pull-down control node QB; a sixth transistor M6 whose first electrode is connected to the reset module 50, whose gate is connected to the pull-down control node QB and whose second electrode is connected to the voltage terminal VGL; a ninth transistor M9 whose first electrode is connected to the second electrode of the fourth transistor M4, whose gate is connected to the pull-up control node Q and whose second electrode is connected to the voltage terminal VGL; and a tenth transistor M10 whose first electrode is connected to the pull-down control node QB, whose gate is connected to the pull-up control node Q and whose second electrode is connected to the voltage terminal VGL.

Further, the first pull-down module 31 comprises: a seventh transistor M7 whose first electrode is connected to the pull-up control node Q, whose gate is connected to the pull-down control node QB and whose second electrode is connected to the voltage terminal VGL; and an eighth transistor M8 whose first electrode is connected to the signal output terminal OUTPUT of the present stage, whose gate is connected to the pull-down control node QB and whose second electrode is connected to the voltage terminal VGL.

Further, the second pull-down module 40 comprises: an eleventh transistor M11 whose first electrode is connected to the signal output terminal OUTPUT of the present stage, whose gate is connected to the second clock signal terminal CLK and whose second electrode is connected to the voltage terminal VGL.

Further, the reset module 50 comprises: a twelfth transistor M12 whose first electrode is connected to the pull-up control node Q, whose gate is connected to the second signal input terminal RESET and whose second electrode is connected to the voltage terminal VGL; a thirteenth transistor M13 whose first electrode is connected to the signal output terminal OUTPUT of the present stage, whose gate is connected to the second signal input terminal RESET and whose second electrode is connected to the voltage terminal VGL; and a fourteenth transistor M14 whose first electrode is connected to the first clock signal terminal CLKB, whose gate is connected to the pull-up control node Q and whose second electrode is connected to the first electrode of the sixth transistor M6.

Herein, the reset module 50 further comprises: a signal trigger terminal COUT of the next stage connected to the second electrode of the fourteenth transistor M14.

In such a way, since the signals input by the first clock signal terminal CLKB and the second clock signal terminal CLK have the same period but inverse phases, in the non-output time, the first pull-down module 31 controls the ON and OFF of the eleventh transistor M11 through the pull-down control QB and the second pull-down module 40. Therefore, the output voltage of the signal output terminal OUTPUT of the present stage connected to them can be pulled down to the low level alternately, enabling the gate lines in the non-output rows to remain in the state of no signal outputting during the above non-output time.

In the following, taking the structure shown in FIG. 3 as an example, and in connection with the input/output time sequence diagram of the shift register unit as shown in FIG. 2, the operation process of the shift register unit will be described in detail.

Phase T1: INPUT=1; CLKB=0; QB=0; CLK=1; Q=1; OUTPUT=0; RESET=0.

Figure 4:
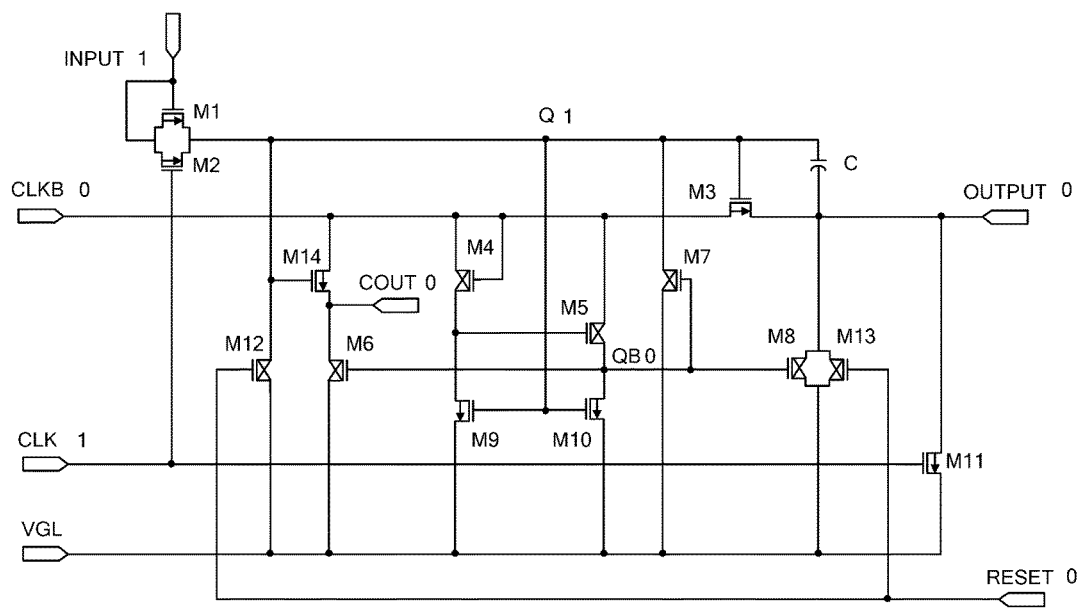
FIGS. 4 to 8 are schematic operation state diagrams of a shift register unit according to an embodiment of the present disclosure.

As shown in FIG. 4, since the first signal input terminal INPUT=1 in phase T1, the first transistor M1 is turned on and controls the shift register to start working, and the first input terminal INPUT charges the capacitor C through the first transistor M1 and pulls up the potential of the pull-up control node Q. Since the second clock signal terminal CLK=1, the second transistor M2 is turned on to accelerate the charging of the capacitor C. The third transistor M3 is turned on, and thus the current stage signal output terminal OUPTPUT=0 and no signal is output since the first clock signal terminal CLKB=0. Because the first clock signal terminal CLKB=0, the fourth transistor M4 and the fifth transistor M5 are turned off to make the pull-down control node QB at the low level QB=0, and the ninth transistor M9 and the tenth transistor M10 are turned on under the control of the high level of the pull-up control node Q such that when the level of the pull-down control node QB is pulled up to the high level mistakenly, the level of the pull-down control node QB can be pulled down to the low level VGL. As such, the first pull-down module 31 is in the non-operation state. However, the second clock signal terminal CLK=1 at this time, so that the eleventh transistor M11 is turned on and the second pull-down module 40 starts working; therefore, the signal output terminal OUTPUT of the present stage can be pulled down to the low level VGL, i.e. OUTPUT=0, thereby controlling the gate lines in the non-output rows to have no signal output. Phase T1 is a charging stage of the capacitor C in the shift register.

Phase T2: INPUT=0; CLKB=1; QB=0; CLK=0; Q=1; OUTPUT=1; RESET=0.

Figure 5:
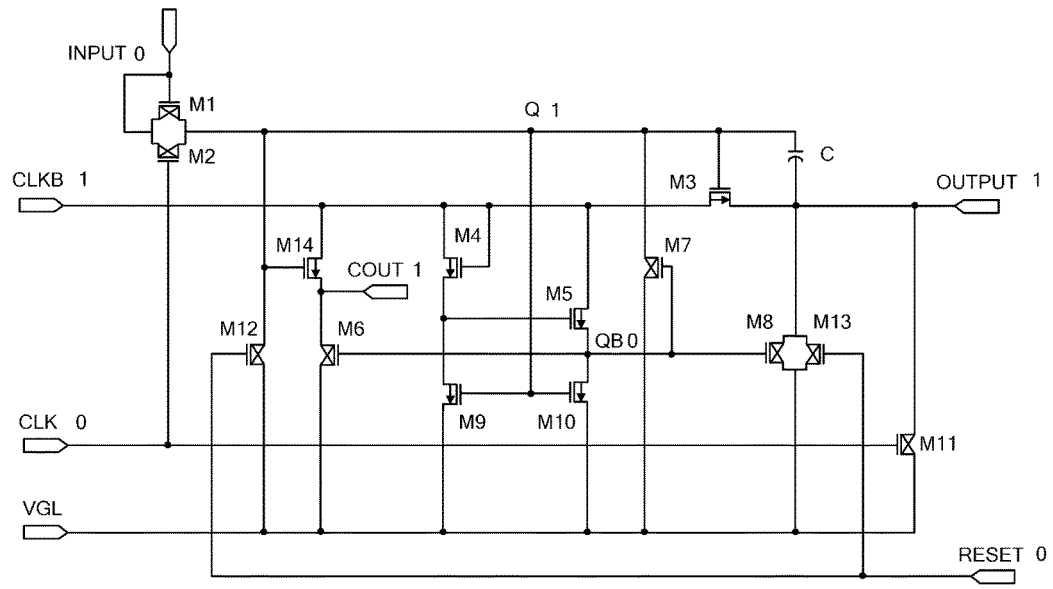

As shown in FIG. 5, since the first signal input terminal INPUT=0 in phase T2 and the second signal terminal CLK=0, the first transistor M1 and the second transistor M2 are turned off. At this time, the eleventh transistor M11 is turned off, and thus the second pull-down module 40 is in the non-operation state. Because the first clock signal terminal CLKB=1, the fourth transistor M4 and the fifth transistor M5 are turned on such that the level of the pull-down control node QB rises. However, because the level of the pull-up control node Q is further pulled up due to the bootstrap effect of the capacitor C, the ninth transistor M9 and the tenth transistor M10 are turned on to pull down the level of the pull-down control node QB to the low level again such that QB=0. In such a way, the sixth transistor M6, the seventh transistor M7 and the eighth transistor M8 are turned off, and the first pull-down module 31 is also in the non-operation state. The pull-up control node Q outputs the high level to turn on the third transistor M3 such that the high level output by the first clock signal terminal CLKB is input to the signal output terminal OUTPUT of the present stage, and then the signal output terminal OUTPUT of the present stage outputs the high level to the gate line in one row corresponding to the gate shift unit to turn on all the TFTs located in this row of gate line within the display area of the display panel so that the data lines begin signal writing. At the same time, the pull-up control node Q outputs the high level to turn on the fourteenth transistor M14; therefore, the signal trigger terminal COUT of the next stage also outputs the high level, such that the signal trigger terminal COUT of the next stage can input a trigger signal to the next stage of shift register unit during the output time. Phase T2 is a phase turning on the shift register.

Phase T3: INPUT=0; CLKB=0; QB=0; CLK=1; Q=0; OUTPUT=0; RESET=1.

Figure 6:
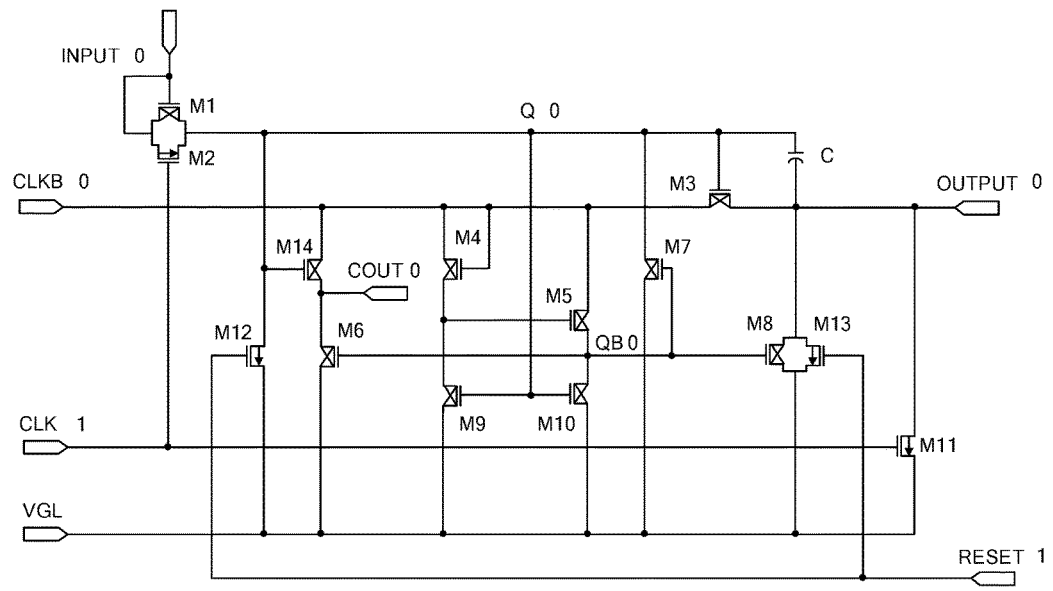

As shown in FIG. 6, because the second signal input terminal RESET=1 in phase T3, the twelfth transistor M12 and the thirteenth transistor M13 are turned on, and the twelfth transistor M12 pulls down the level of the pull-up control node Q and the signal output by the signal output terminal OUTPUT of the present stage to the low level VGL such as to prevent the pull-up control node Q or the signal output by the signal output terminal OUTPUT of the present stage becoming the high level due to the effect of other inference signals. Because the twelfth transistor M12 and the thirteenth transistor M13 can be turned on simultaneously and finally cause the signal output terminal OUTPUT of the present stage to output the low level, when one of the two TFTs fails, the other can still keep the signal output terminal OUTPUT of the present stage to output the low level. Such a configuration functions as double insurances, to better prevent the signal output terminal OUTPUT of the present stage from becoming the high level under the effect of other inference signals and causing the turning-on mistake of gate line due to the turning on of the row of the controlled gate line under the function of the high level.

In addition, the first clock signal CLKB=0, and the fourth transistor M4 and the fifth transistor M5 are turned off such that the pull-down control node QB is at the low level QB=0; therefore, the sixth transistor M6, the seventh transistor M7 and the eighth transistor M8 are turned off, and the first pull-down module 31 is in the non-operation state. At the same time, the second clock signal terminal CLK=1, the eleventh transistor M11 is turned on, and the second pull-down module 40 starts to work, such as to pull down the signal output by the current stage signal input terminal OUTPUT to the low level VGL, i.e. OUTPUT=0, so that the gate line corresponding to the shift register unit has no signal outputting during the non-output time. Phase T3 is a phase resetting the shift register.

Phase T4, INPUT=0; CLKB=1; QB=1; CLK=0; Q=0; OUTPUT=0; RESET=0.

Figure 7:
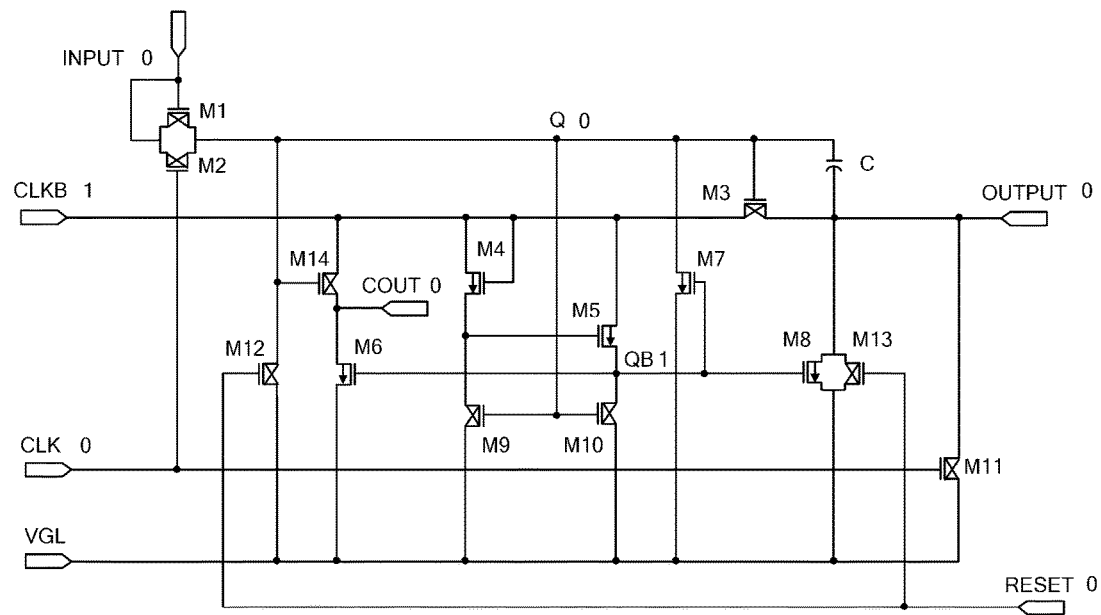

As shown in FIG. 7, because the first signal input terminal INPUT=0 in phase T4, the second clock signal terminal CLK=0 and the second signal input terminal RESET=0, the first transistor M1, the second transistor M2, the third transistor M3, the ninth transistor M9, the tenth transistor M10, the twelfth transistor M12, the thirteenth transistor M13 and the fourteenth transistor M14 are all turned off, at the same time, the eleventh transistor M11 is also turned off, and the second pull-down module 40 is in the non-operation state. Because the first clock signal terminal CLKB=1, the fourth transistor M4 and the fifth transistor M5 are turned on such that the level of the pull-down control node QB rises to QB=1. In such a way, the sixth transistor M6, the seventh transistor M7 and the eighth transistor M8 are turned on, and the sixth transistor M6 pulls down the level of the signal trigger terminal COUT of the next stage to the low level VGL such that the signal trigger terminal COUT of the next stage cannot input a trigger signal to the next stage of shift register unit within the non-output time. The eighth transistor M8 pulls down the signal output by the signal output terminal OUTPUT of the present stage to the low level VGL such that the signal output terminal OUTPUT of the present stage-0 and no signal is output within the non-output time.

Phase T5: INPUT=0; CLKB=0; QB=0; CLK=1; Q=0; OUTPUT=0; RESET=0.

Figure 8:
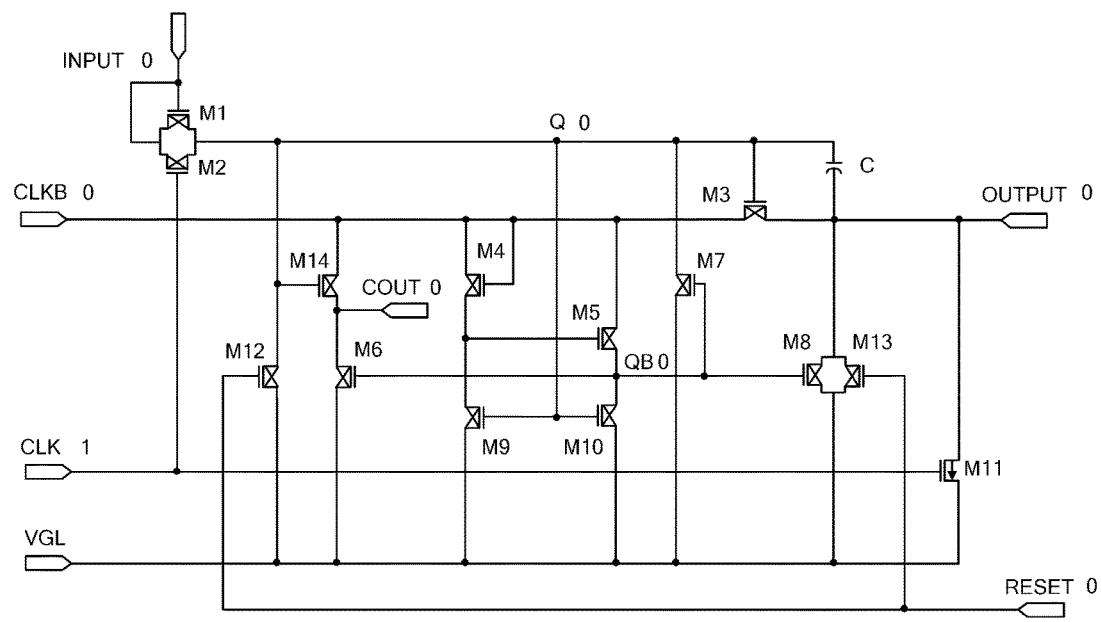

As shown in FIG. 8, because the first signal input terminal INPUT=0, the first clock signal terminal CLKB=0, the second signal input terminal RESET=0 in phase T5, the first transistor M1, the second transistor M2, the third transistor M3, the fourth transistor M4, the fifth transistor M5, the twelfth transistor M12 and the thirteenth transistor M13 are all turned off and the level of the pull-up control node Q is the low level; therefore, the ninth transistor M9, the tenth transistor M10 and the fourteenth transistor M14 are also at the OFF state. The level of the pull-down control node QB is the low level such that the sixth transistor M6, the seventh transistor M7 and the eighth transistor M8 are also turned off. The second clock signal CLK=1, and the eleventh transistor M11 is turned on, which can pull down the signal output by the signal output terminal OUTPUT of the present stage to the low level VGL, thereby preventing the signal output terminal OUTPUT of the present stage from becoming the high level under the effect of other inference signals to cause the gate line turning-on mistake due to the turning on of the row of gate line controlled by it under the high level.

Thereafter, the shift register repeats phases T4 and T5 until the first signal input terminal INPUT becomes the high level again. This period can be referred to as the non-operation time of the shift register unit. Phases T1 to T3 can be referred to as the operation time of the shift register unit. The signal output terminal OUTPUT of the present stage and the signal trigger terminal COUT of the next stage output the high level only in phase T2, i.e., the phase in which the shift register is turned on, and no signal is output at other times which are the non-output time.

To sum up, it can be seen that, since the output waveforms of the first clock signal terminal CLKB and the second clock signal terminal CLK are complementary, they can pull down the output levels of the signal output terminal OUTPUT of the present stage and the signal trigger terminal COUT of the next stage to the level VGL alternately by controlling the first pull-down module 31 and the second pull-down module 40. In such a way, the signal output terminal OUTPUT of the present stage and the signal trigger terminal COUT of the next stage can keep the gate line in the row corresponding to the shift register unit in the stage of no signal outputting in the non-output time.

Figure 9:
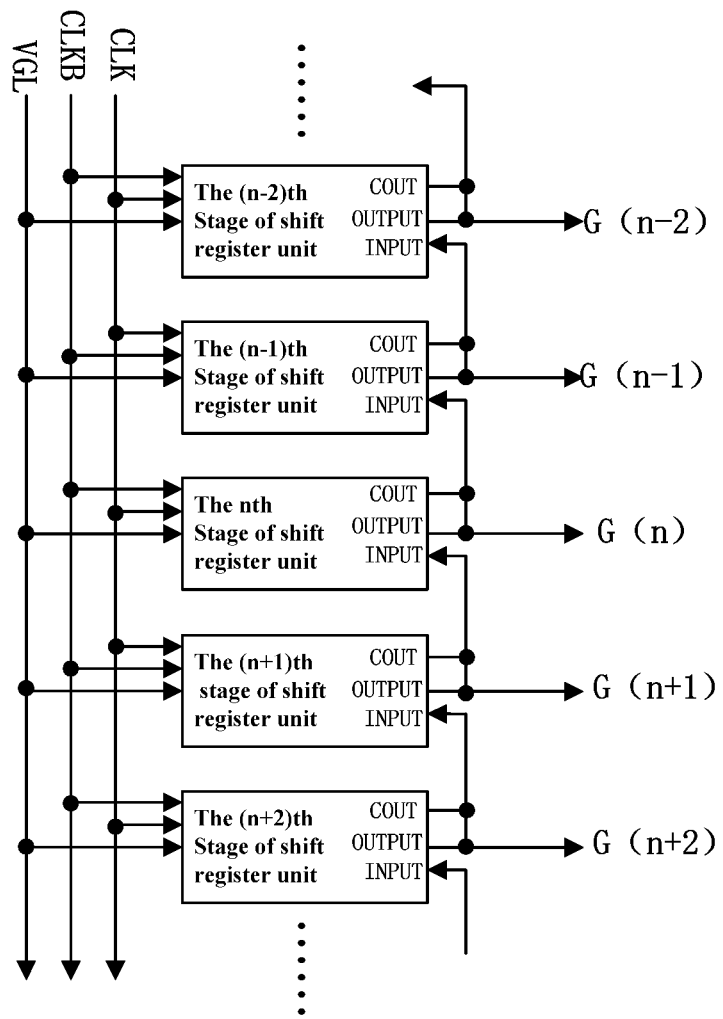
FIG. 9 is a schematic structural diagram of a gate driving circuit according to an embodiment of the present disclosure.

An embodiment of the present disclosure provides a gate driving circuit, as shown in FIG. 9, which comprises multiple stages of shift register units as described in the above. In FIG. 9, description is made by taking only 5 shift register units as an example, which are the $(n-2)^{th}$ stage of shift register unit, the $(n-1)^{th}$ stage of shift register unit, the $n^{th}$ stage of shift register unit, the $(n+1)^{th}$ stage of shift register unit and the $(n+2)^{th}$ stage of shift register unit.

Herein, the output terminal OUTPUT of each stage of shift register unit outputs a row scan signal G of the current stage. Each shift register unit has one first clock signal terminal CLKB and one second clock signal terminal CLK to input signals. The signals input by the first clock signal terminal CLKB and the second clock signal terminal CLK have the phase difference of 180 degree, and the signals input by both the first clock signal terminal CLKB and the second clock signal terminal CLK output the high level for one half time in respective operation periods and output the low level for another half time.

VGL can be VSS.

The signal input terminal (e.g. G(n−1)) of each shift register unit except for the first stage of shift register unit is connected to the signal output terminal OUTPUT of the present stage of its adjacent previous stage of shift register unit.

The signal output terminal OUTPUT of the present stage of each shift register except for the last stage of shift register unit is connected to the signal input terminal (e.g. G(n−1)) of its adjacent next stage of shift register unit.

Further, the signal input terminal of each shift register unit except for the first stage of shift register unit is connected to the signal trigger terminal COUT of the next stage of its adjacent previous stage of shift register unit.

The signal trigger terminal COUT of the next stage of each shift register unit except for the last stage of shift register unit is connected to the signal input terminal of its adjacent next stage of shift register unit.

In such a way, the output G(n) of the $n^{th}$ stage of shift register unit is not only fed back to the $(n-1)^{th}$ stage of shift register unit to turn off the $(n-1)^{th}$ stage of shift register emit, but also outputs a signal to the $(n+1)^{th}$ stage of shift register unit as the trigger signal of the $(n+1)^{th}$ stage of shift register unit.

An embodiment of the present disclosure provides a gate driving circuit. The gate driving circuit comprises shift register units. The shift register unit comprises an input module, a pull-up module, a pull-down control module, a first pull-down module, a second pull-down module and a reset module. In the non-output time, the first pull-down module and the second pull-down module pull down the output voltages of the pull-up modules connected thereto to a low level alternately, thereby enabling gate lines in non-output rows to remain in the state of no signal outputting.

An embodiment of the present disclosure provides a display device comprising any gate driving circuit as described in the above. The display device has the same beneficial effects as the gate driving circuit provided in the above embodiments of the present disclosure. Since the gate driving circuit has been described in detail in the above embodiments, it will not be described repeatedly here.

In particular, the display device can be any liquid crystal display product or means with display function such as a liquid crystal display, a liquid crystal TV set, a digital photo frame, a cell phone, a flat pad computer, etc.

An embodiment of the present disclosure provides a display apparatus comprising a gate driving circuit. The gate driving circuit comprises shift register units. The shift register unit comprises an input module, a pull-up module, a pull-down control module, a first pull-down module, a second pull-down module and a reset module. In the non-output time, the first pull-down module and the second pull-down module pull down the output voltages of the pull-up modules connected thereto to a low level alternately, enabling gate lines in non-output rows to remain in the state of no signal outputting.

It can be understood by those ordinary skilled in the art that all or part steps implementing the above method embodiments can be accomplished by a program instructing related hardware. The above program can be stored in a computer-accessible storage medium. When the program is being executed, the steps including the above method embodiments are performed. The above-mentioned storage medium comprises various media that can store program codes, such as ROM, RAM, magnetic disk, optical disk or the like.

The above is only specific implementation of the present disclosure, but the protection scope of the present disclosure is not limited to that. Those variations or replacements easily devised by those skilled in the art within the technical scope disclosed by the present disclosure should fall in the protection scope of the present disclosure. Therefore, the protection scope of the present disclosure should be defined by the scope of the claims.

What is claimed is:

1. A shift register unit comprising:
an input subcircuit connected to a first signal input terminal and a pull-up control node respectively, and configured to control potential of the pull-up control node according to a signal input by the first signal input terminal;
a pull-up subcircuit connected to a first clock signal terminal, the pull-up control node and a signal output terminal of the present stage respectively, and configured to make the signal output terminal of the present stage output a signal of the first clock signal terminal under the control of the pull-up control node;
a pull-down control subcircuit connected to a voltage terminal, the pull-up control node, the first clock signal terminal, and a pull-down control node respectively, and configured to control the level of the pull-down control node according to the signal input by the first clock signal terminal and the level of the pull-up control node;
a first pull-down subcircuit connected to the voltage terminal, the pull-up control node, the pull-down control node and the signal output terminal of the present stage respectively, and configured to pull down a signal output by the signal output terminal of the present stage to a low level under the control of the pull-down control node;
a second pull-down subcircuit connected to the voltage terminal, a second clock signal terminal and the signal output terminal of the present stage respectively, and configured to pull down the signal output by the signal output terminal of the present stage to a low level according to a signal input by the second clock signal terminal; and
a reset subcircuit connected to the voltage terminal, a second signal input terminal, the pull-up control node and the signal output terminal of the present stage respectively, and configured to reset the potential of the pull-up control node and the signal output by the signal output terminal of the present stage according to a signal input by the second signal input terminal,
wherein the pull-down control subcircuit comprises:
a fourth transistor whose first electrode and gate are connected to the first clock signal terminal;
a fifth transistor whose first electrode is connected to the first clock signal terminal, gate is connected to the second electrode of the fourth transistor and second electrode is connected to the pull-down control node;
a sixth transistor whose first electrode is connected to the reset subcircuit, gate is connected to the pull-down control node and second electrode is connected to the voltage terminal;
a ninth transistor whose first electrode is connected to the second electrode of the fourth transistor, gate is directly connected to the pull-up control node and second electrode is connected to the voltage terminal; and
a tenth transistor whose first electrode is connected to the pull-down control node, gate is connected to the pull-up control node and second electrode is connected to the voltage terminal,
wherein the first pull-down subcircuit comprises:
a seventh transistor whose first electrode is connected to the pull-up control node, gate is connected to the pull-down control node and second electrode is connected to the voltage terminal; and
an eighth transistor whose first electrode is connected to the signal output terminal of the present stage, gate is connected to the pull-down control node and second electrode is connected to the voltage terminal.

2. The shift register unit according to claim 1, wherein the input subcircuit comprises:
a first transistor whose first electrode and gate are connected to the first signal input terminal and second electrode is connected to the pull-up control node;
a second transistor whose first electrode is connected to the first signal input terminal, gate is connected to the second clock signal terminal and second electrode is connected to the pull-up control node.

3. The shift register unit according to claim 2, wherein the pull-up subcircuit comprises:
a third transistor whose first electrode is connected to the first clock signal terminal, gate is connected to the pull-up control node and second electrode is connected to the signal output terminal of the present stage; and
a capacitor connected between the gate and the second electrode of the third transistor in parallel.

4. The shift register unit according to claim 1, wherein the second pull-down subcircuit comprises:
an eleventh transistor whose first electrode is connected to the signal output terminal of the present stage, gate is connected to the second clock signal terminal and second electrode is connected to the voltage terminal.

5. The shift register unit according to claim 4, wherein the reset subcircuit comprises:
a twelfth transistor whose first electrode is connected to the pull-up control node, gate is connected to the second signal input terminal and second electrode is connected to the voltage terminal;
a thirteenth transistor whose first electrode is connected to the signal output terminal of the present stage, gate is connected to the second signal input terminal and second electrode is connected to the voltage terminal; and
a fourteenth transistor whose first electrode is connected to the first clock signal terminal, gate is connected to the pull-up control node and second electrode is connected to the first electrode of the sixth transistor.

6. The shift register unit according to claim 5, wherein the reset subcircuit further comprises:
a signal trigger terminal of the next stage connected to the second electrode of the fourteenth transistor.

7. A gate driving circuit comprising multiple stages of shift register units according to claim 1;
a signal input terminal of each shift register unit except for the first stage of shift register unit is connected to the signal output terminal of the present stage of its adjacent previous stage of shift register unit; and
a signal output terminal of the present stage of each shift register except for the last stage of shift register unit is connected to the signal input terminal of its adjacent next stage of shift register unit.

8. The gate driving circuit according to claim 7, wherein the signal input terminal of each shift register unit except for the first stage of shift register unit is connected to the signal trigger terminal of the next stage of its adjacent previous stage of shift register unit;
the signal trigger terminal of the next stage of each shift register unit except for the last stage of shift register unit is connected to the signal input terminal of its adjacent next stage of shift register unit.

9. The gate driving circuit according to claim 7, wherein the reset subcircuit comprises:
a twelfth transistor whose first electrode is connected to the pull-up control node, gate is connected to the second signal input terminal and second electrode is connected to the voltage terminal;
a thirteenth transistor whose first electrode is connected to the signal output terminal of the present stage, gate is connected to the second signal input terminal and second electrode is connected to the voltage terminal; and
a fourteenth transistor whose first electrode is connected to the first clock signal terminal, gate is connected to the pull-up control node and second electrode is connected to a first electrode of the sixth transistor.

10. The gate driving circuit according to claim 9, wherein the reset subcircuit further comprises:
a signal trigger terminal of the next stage connected to the second electrode of the fourteenth transistor.

11. A display device comprising a gate driving circuit according to claim 7.

12. The gate driving circuit according to claim 7, wherein the pull-up subcircuit comprises:
a third transistor whose first electrode is connected to the first clock signal terminal, gate is connected to the pull-up control node and second electrode is connected to the signal output terminal of the present stage; and
a capacitor connected between the gate and the second electrode of the third transistor in parallel.

13. The gate driving circuit according to claim 12, wherein the pull-down control subcircuit comprises:
a fourth transistor whose first electrode and gate are connected to the first clock signal terminal;
a fifth transistor whose first electrode is connected to the first clock signal terminal, gate is connected to the second electrode of the fourth transistor and second electrode is connected to the pull-down control node;
a sixth transistor whose first electrode is connected to the reset subcircuit, gate is connected to the pull-down control node and second electrode is connected to the voltage terminal;
a ninth transistor whose first electrode is connected to the second electrode of the fourth transistor, gate is connected to the pull-up control node and second electrode is connected to the voltage terminal; and
a tenth transistor whose first electrode is connected to the pull-down control node, gate is connected to the pull-up control node and second electrode is connected to the voltage terminal.

14. The gate driving circuit according to claim 13, wherein the first pull-down subcircuit comprises:
a seventh transistor whose first electrode is connected to the pull-up control node, gate is connected to the pull-down control node and second electrode is connected to the voltage terminal; and
an eighth transistor whose first electrode is connected to the signal output terminal of the present stage, gate is connected to the pull-down control node and second electrode is connected to the voltage terminal.

15. The gate driving circuit according to claim 14, wherein the second pull-down subcircuit comprises:
an eleventh transistor whose first electrode is connected to the signal output terminal of the present stage, gate is connected to the second clock signal terminal and second electrode is connected to the voltage terminal.

16. The gate driving circuit according to claim 15, wherein the reset subcircuit comprises:
a twelfth transistor whose first electrode is connected to the pull-up control node, gate is connected to the second signal input terminal and second electrode is connected to the voltage terminal;

a thirteenth transistor whose first electrode is connected to the signal output terminal of the present stage, gate is connected to the second signal input terminal and second electrode is connected to the voltage terminal; and a fourteenth transistor whose first electrode is connected to the first clock signal terminal, gate is connected to the pull-up control node and second electrode is connected to the first electrode of the sixth transistor.

17. The gate driving circuit according to claim 16, wherein the reset subcircuit further comprises:
a signal trigger terminal of the next stage connected to the second electrode of the fourteenth transistor.

18. The gate driving circuit according to claim 17, wherein the reset subcircuit further comprises:
a signal trigger terminal of the next stage connected to the second electrode of the fourteenth transistor.

19. The gate driving circuit according to claim 7, wherein the input subcircuit comprises:
a first transistor whose first electrode and gate are connected to the first signal input terminal and second electrode is connected to the pull-up control node;
a second transistor whose first electrode is connected to the first signal input terminal, gate is connected to the second clock signal terminal and second electrode is connected to the pull-up control node.

* * * * *